(12) United States Patent
Lück

(10) Patent No.: US 9,582,450 B2
(45) Date of Patent: Feb. 28, 2017

(54) RACK, SERVER AND ASSEMBLY COMPRISING SUCH A RACK AND AT LEAST ONE SERVER

(75) Inventor: Thomas Lück, Augsburg (DE)

(73) Assignee: FUJITSU TECHNOLOGY SOLUTIONS INTELLECTUAL PROPERTY GMBH, Munich (DE)

( * ) Notice: Subject to any disclaimer, the term of this patent is extended or adjusted under 35 U.S.C. 154(b) by 554 days.

(21) Appl. No.: 14/008,261

(22) PCT Filed: Mar. 21, 2012

(86) PCT No.: PCT/EP2012/055005
§ 371 (c)(1),
(2), (4) Date: Oct. 18, 2013

(87) PCT Pub. No.: WO2012/130691
PCT Pub. Date: Oct. 4, 2012

(65) Prior Publication Data
US 2014/0040524 A1    Feb. 6, 2014

(30) Foreign Application Priority Data

Mar. 30, 2011  (DE) .................. 10 2011 015 548
Apr. 18, 2011  (DE) .................. 10 2011 017 386

(51) Int. Cl.
*G02B 6/36*    (2006.01)
*G06F 13/40*   (2006.01)
(Continued)

(52) U.S. Cl.
CPC ........... *G06F 13/4027* (2013.01); *G02B 6/43* (2013.01); *G06F 1/181* (2013.01); *G06F 1/20* (2013.01);
(Continued)

(58) Field of Classification Search
CPC .......... G02B 6/36; G06F 13/148; G06F 13/14
(Continued)

(56) References Cited

U.S. PATENT DOCUMENTS 4,612,670 A     9/1986  Henderson
5,726,788 A  *  3/1998  Fee .................... H04B 10/2933
                                                       370/360
(Continued)

FOREIGN PATENT DOCUMENTS

DE   112008003655 T5   1/2011
EP       0486208 A2    5/1992
(Continued)

OTHER PUBLICATIONS

Japanese Office Action dated Aug. 5, 2014 along with an English translation from corresponding Japanese Patent Application No. 2014-501538.

*Primary Examiner* — Christopher Shin
(74) *Attorney, Agent, or Firm* — Fujitsu Patent Center (57) ABSTRACT

A rack with a mounting bay to accommodate servers, wherein 1) the mounting bay defines two opposing internal areas disposed parallel to an insertion direction of the servers and divided into a multiplicity of slots, 2) one or more data lines for data connection of servers are configured in the rack, 3) the data lines include optical data lines, and 4) on at least one of the two internal areas of the mounting bay, an end section of a data line with a data interface is disposed on each slot such that a contactless optical data connection to a further data interface on a corresponding server is enabled.

15 Claims, 3 Drawing Sheets

(51) Int. Cl.
G06F 1/18 (2006.01)
G06F 1/20 (2006.01)
H05K 7/14 (2006.01)
G02B 6/43 (2006.01)
H05K 7/20 (2006.01)
G06F 13/14 (2006.01)

(52) U.S. Cl.
CPC ......... *G06F 13/409* (2013.01); *H05K 7/1452* (2013.01); *H05K 7/1492* (2013.01); *H05K 7/20736* (2013.01)

(58) Field of Classification Search
USPC .................. 385/59, 77, 88; 398/45; 710/305
See application file for complete search history.

(56) References Cited

U.S. PATENT DOCUMENTS

| | | | | |
|---|---|---|---|---|
| 5,793,919 A * | 8/1998 | Payne | ................... | G02B 6/2804 385/134 |
| 6,016,211 A * | 1/2000 | Szymanski | ............... | G02B 6/43 359/108 |
| 6,038,048 A | 3/2000 | Harris et al. | | |
| 6,310,992 B1 | 10/2001 | Gehrke et al. | | |
| 6,398,424 B1 * | 6/2002 | Jin | ..................... | G02B 6/3696 385/59 |
| 6,623,177 B1 * | 9/2003 | Chilton | ................... | G02B 6/43 385/134 |
| 6,795,609 B1 * | 9/2004 | Lichtman | ............ | H04B 10/801 385/24 |
| 6,842,571 B2 | 1/2005 | Kramer et al. | | |
| 7,010,232 B1 * | 3/2006 | Ott | ...................... | H04B 10/801 398/154 |
| 7,291,032 B1 | 11/2007 | Carver et al. | | |
| 8,755,191 B2 * | 6/2014 | Riebel | .................. | H05K 7/1488 361/679.38 |
| 2002/0021873 A1 * | 2/2002 | Patzelt | ................ | G02B 6/4201 385/88 |
| 2003/0142924 A1 * | 7/2003 | Ikeda | .................... | H01S 5/4025 385/88 |
| 2007/0077998 A1 * | 4/2007 | Petrisor | ................. | H04H 20/62 463/42 |
| 2007/0293065 A1 * | 12/2007 | Sato | ..................... | H05K 9/0007 439/130 |
| 2009/0195363 A1 * | 8/2009 | Downie | .................. | G06K 5/02 340/10.4 |
| 2009/0319399 A1 * | 12/2009 | Resta | ................... | G06Q 10/087 705/28 |
| 2011/0268441 A1 * | 11/2011 | Goldstein | ........... | G02B 6/3512 398/45 |
| 2012/0134678 A1 * | 5/2012 | Roesner | ................. | G06F 13/14 398/115 |
| 2012/0269514 A1 * | 10/2012 | Nedovic | .............. | H04B 10/801 398/66 |
| 2014/0185988 A1 * | 7/2014 | Qi | ......................... | G02B 6/428 385/77 |

FOREIGN PATENT DOCUMENTS

| | | |
|---|---|---|
| JP | 11-266088 | 9/1999 |
| JP | 2001-244661 | 9/2001 |
| JP | 2004-311956 | 11/2004 |
| WO | 2009/096974 A1 | 8/2009 |
| WO | 2010/080158 A1 | 7/2010 |

* cited by examiner

RACK, SERVER AND ASSEMBLY COMPRISING SUCH A RACK AND AT LEAST ONE SERVER

TECHNICAL FIELD

This disclosure relates to a rack with a mounting bay to accommodate servers, wherein the mounting bay defines two opposing internal areas in the housing which are disposed parallel to an insertion direction of the servers and are divided into a multiplicity of slots, and wherein one or more data lines for the data connection of servers are configured in the rack.

The disclosure further relates to a server and an assembly with a rack and at least one server, which is inserted into a slot of the mounting bay.

BACKGROUND

Servers inserted into a rack are typically contacted via electrical lines from the front and/or from behind (i.e. on the surfaces perpendicular to the insertion direction) for the data exchange and for the power supply. An electrical contacting is effected either with a backplane or midplane in the rack or directly via electrical lines to a further server, a data switching unit (e.g. switch) or to a power supply unit. Since the servers are typically cooled by an airstream in the insertion direction on the rack, the various connections may in some circumstances severely hinder the airflow.

Solutions already exist to minimize the number of connections or the area on the front side and/or rear side of the servers required by the connections by narrow construction. More area for the through-flow of a cooling airstream can be obtained in this way. Further solutions provide for an improved design of the data connections themselves which further reduce the required area. In particular, the use of optical data connections exerts an increasing influence here. However, those solutions allow only a limited improvement in terms of the air throughput in the rack.

It could therefore be helpful to provide a rack, a server and an assembly comprising a rack and a server of the aforementioned type by which an improved cooling effect of servers in a rack is achieved and a data connection with a high data throughput for the data connection of the servers in the rack is nevertheless provided.

SUMMARY

I provide a rack with a mounting bay to accommodate servers, wherein 1) the mounting bay defines two opposing internal areas disposed parallel to an insertion direction of the servers and divided into a multiplicity of slots, 2) one or more data lines for data connection of servers are configured in the rack, 3) the data lines comprise optical data lines, and 4) on at least one of the two internal areas of the mounting bay, an end section of a data line with a data interface is disposed on each slot such that a contactless optical data connection to a further data interface on a corresponding server is enabled.

I also provide a server adapted to be inserted into a slot of a rack, wherein the server, at least on one external wall, has an end section of an optical data line with a data interface configured to enable a contactless optical data connection to a data interface of the rack.

I further provide an assembly with a rack and at least one server adapted to be inserted into a slot of a rack, wherein the server, at least on one external wall, has an end section of an optical data line with a data interface configured to enable a contactless optical data connection to a data interface of the rack inserted into a slot of the mounting bay, wherein the server has the end section of the optical data line with the data interface at least on one external wall disposed parallel to the corresponding internal area on the slot, and wherein the data interface of the server is disposed level with the data interface of the slot such that a contactless optical data connection between the two data interfaces is enabled.

REFERENCE NUMBER LIST

1 Rack
2 Housing
3 Mounting bay
4a, 4b Internal walls
5, 5a, 5b Slot
6a, 6b Data line
7a, 7b End section
8a, 8b Data interface
9 Server
10 Fan
11 Switching unit
12 External wall of the server
13 Assembly device
14a, 14b Optical system
15a, 15b Adjusting element
L1, L2 Lens
B1, B2 System board
S Transmitting unit
D Detector unit

DETAILED DESCRIPTION

I provide a rack wherein the data lines may comprise optical data lines, wherein, on at least one of the two internal areas of the mounting bay, an end section of a data line with a data interface is disposed on each slot such that a contactless optical data connection to a further data interface on a corresponding server is enabled.

A solution of this type has a plurality of advantages. On the one hand, the data interfaces for the data connection of servers inserted in the mounting bay are laid from an area perpendicular to the insertion direction to an area which lies parallel to the insertion direction in the mounting bay. This means that areas perpendicular to the insertion direction of servers can be designed with fewer connections or in some circumstances free from connections. Through this arrangement, it is achieved that data interfaces no longer lie in the airstream of a cooling airstream through the rack, as a result of which the cooling would be impeded. Similarly, the problem that optical fiber contacts of the optical data connections possibly respond sensitively to temperature changes could be avoided in that the contacts then no longer lie in the airstream and in some circumstances are loaded with a temperature gradient.

In this context, the term "rack" comprises all carrying structures that accommodate one or more slot-in devices, in particular servers. A rack can thus, for example, form a server rack. This server rack can have a housing with walls for the stable and protected housing of servers, or can simply act as a frame structure. However, the rack can also form a frame-shaped chassis with walls, as used, for example, to house and connect blade servers in corresponding systems.

The term "internal area" in the mounting bay comprises an area formed by the (lateral) limitations of the mounting bay by the rack. In the case of a simply frame-shaped structure of the rack, the internal area may be formed, for example, from a juxtaposition of carrying elements for the servers. If the mounting bay forms walls in the rack, the internal area can also be designed as an internal wall of the mounting bay.

The end sections of the data lines with the data interfaces are disposed such that at least one data interface is configured per slot in the rack for the data connection to a server which is inserted into this slot. It is possible to provide end sections of the data lines with data interfaces on only one or on both corresponding internal areas in the rack.

On the other hand, due to the configuration of an optical data connection between an inserted server and the rack, the solution enables a high data throughput with data rates in the Gbit/s range. Furthermore, the advantage of the contactless optical data connection is provided, as a result of which wearing parts such as connectors and connector contacts can be completely dispensed with for this purpose. A canting or damaging of these connector contacts on insertion of a server into the rack is therefore excluded.

In some circumstances, a data connection of this type also allows a more compact and more space-saving design of the data interfaces since space for connectors and connector contacts can be saved. In particular, the contactless optical data connection can be configured such that the data connection is set up over only a few millimeters between the rack and a server.

Means are preferably configured in the rack and/or in an inserted server itself to generate a cooling airstream such that the direction of the cooling airstream is formed parallel to the insertion direction of the servers. The data interfaces for the optical data connection do not lie perpendicular to the cooling airstream, but on internal areas parallel to the cooling airstream. As a result, the cooling airstream is not impeded. In fact, the cooling airstream can flow through ventilation openings created by laying the data interfaces from areas perpendicular to the insertion direction away to areas parallel to the insertion direction.

Various solutions can be used for the design of the optical data connections via the data interfaces. In particular, the end sections of the data lines with the data interfaces are advantageously directed toward a corresponding server and in each case have an optical waveguide. The end sections may, for example, have an optical fiber cable as an optical waveguide, and an optical system connected thereto, in particular an assembly with at least one lens for the incoupling and uncoupling of light waves. A design of this type is based on the principle that light signals from one optical fiber are conducted via a lens assembly into the other optical fiber. The lens assembly enables bundling of the light waves and directional incoupling and uncoupling of light waves into or out of an optical fiber.

In each case, the end sections of the data interfaces advantageously have an assembly of one or more adjusting elements configured for the fine-mechanical alignment of the optical system. An exclusively rough-mechanical alignment of optical fibers for the optical data connection is insufficient, particularly due to the mechanical manufacturing tolerances or in the case of vibrations in the computer system which are caused, for example, by rotating parts of optical drives or hard disks. The end sections with the optical system are therefore mounted in a floating manner in the rack. The fine adjustment is carried out by the adjusting elements configured, for example, as permanent magnets and/or electromagnets or piezo elements for the alignment of the end sections away toward further end sections of data interfaces on servers. In the case of the design as electromagnets or piezo elements, control electronics must be provided accordingly.

The entire end sections with the data interfaces—not only their optical system—are advantageously variable in their position on the inner wall of the slot in the mounting bay. This offers the advantage that the end sections can be adapted in their position to an installation depth (in the insertion direction) and/or installation height (perpendicular to the insertion direction) of an inserted server, for example, for the alignment away toward a further data interface on the server. The end sections can, for example, be designed flexibly in their position, for example, via prefabricated assembly devices.

The data lines are preferably routed in the rack and connected to a switching unit disposed in the rack for the selective connection of servers which have set up or wish to set up a contactless optical data connection to a data interface in the rack. A switching unit of this type may, for example, be a switch or router for the further switching of data connections. Alternatively, the data lines may also be simply routed out of the rack for further connection to be contacted from there in a conventional manner with further components and devices in a server architecture. It is appropriate here to route the data lines laterally along the internal areas with the end sections of the data interfaces to a front side or rear side of the rack. A further contacting can be effected there.

I also provide a server configured to be inserted into a slot of a rack and which, at least on one outer wall, has an end section of an optical data line with a data interface configured to enable a contactless optical data connection to a data interface of the rack.

The end section of the data line with the data interface in the server can preferably be designed in the same or in a similar manner, as already explained for the data interface in the rack. In particular, a floating mounting and fine adjustment of an optical system via adjusting elements can be configured here as well.

The end section of the data interface in the server is also preferably variable in its position on the external wall of the server. As already explained for the rack, an assembly device can also be used here to adapt the position of the end section of the data interface in the server to the position of the end section of the data interface in the rack such that both data interfaces, despite the variable installation depth of a server in the mounting bay of the rack, can enable a contactless optical data connection.

I further provide an assembly with a rack of the aforementioned type and at least one server of the aforementioned type inserted into a slot of the mounting bay. The server has its end section of the optical data line with the data interface at least on one external wall disposed parallel to the corresponding internal area on the slot, wherein the data interface of the server is disposed level with the data interface of the slot such that a contactless optical data connection is enabled between the two data interfaces.

The server and the assembly comprising a rack and a server enable a lateral contacting of the server inserted into the rack via an optical contactless data connection to the rack. The server has an end section of a corresponding connection module with a data interface for the optical data set-up to the corresponding end section in the slot of the rack. In the assembly, the two end sections are disposed such that they are congruent when this server is completely inserted into the slot in the mounting bay.

Further advantageous designs are disclosed in the following description of the figures.

Figure 1:
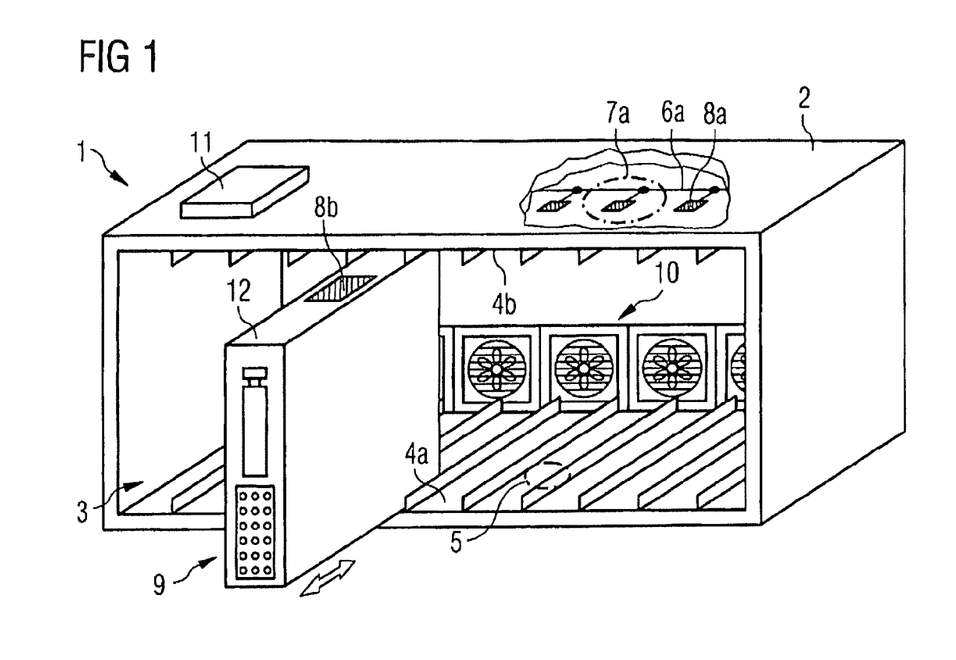
FIG. 1 shows a top view of an assembly comprising a rack and a server.

FIG. 1 shows a top view of an assembly comprising a rack 1 and a server 9. The rack 1 has a housing 2 to accommodate slot-in components, in particular servers or blade servers. A mounting bay 3 is configured in the housing 2 to accommodate servers 9. The mounting bay 3 defines in particular two internal areas which form internal walls 4a and 4b on the housing 2, wherein the internal walls 4a and 4b are divided into a multiplicity of slots 5. Each slot 5 serves to accommodate one server 9. Holding elements and guide rails can be provided on a respective slot 5 to accommodate, hold and carry the server 9, as indicated schematically here.

Fans 10 are furthermore disposed on a rear wall in the mounting bay 3 to generate a cooling airstream parallel to an insertion direction (see arrow direction) of a server 9 into the mounting bay 3. In this way, a server 9 inserted into the mounting bay 3 can be actively cooled.

For the data connection, the rack 1 has a data line 6a advantageously designed as an optical data line, for example, via optical fiber or other optical waveguides. The data line 6a is integrated into the internal wall 4b on the housing 2. Level with each slot 5, the data line 6a has end sections 7a on which data interfaces 8a emerge. The housing 2 therefore has the facility on each slot 5 to set up an optical data connection to a server 9 inserted into the slot 5, as explained in detail below. It is possible to integrate further data interfaces 6a of this type also into the internal wall 4a on the underside of the rack 1.

The data line 6a with the end sections 7a and the data interfaces 8a emerging thereon is advantageously displaced away from a rear wall of the housing 2 to the internal wall 4b (or 4a) disposed parallel to an insertion direction of servers 9. The data interfaces 8a do not therefore lie perpendicular to the insertion direction of a server 9 or to an airstream through the rack 1. In fact, free space is created on the rear wall of the housing 2 to configure ventilation openings or, as shown here, to configure fans 10 to generate a cooling airstream parallel to the insertion direction of the servers 9 through the mounting bay 3.

The server 9 partially inserted into a slot 5 has a further data interface 8b on an external wall 12 configured parallel to the internal wall 4b of the housing 2. If the server 9 is inserted in the insertion direction completely into the slot 5, the data interface 8b becomes level with a corresponding data interface 8a in the slot 5 such that an optical contactless data connection can be set up between the data interfaces 8a and 8b. Also through displacement of the data interface 8b from a rear wall of the server 9 to the lateral external wall 12, free space for the ventilation openings for cooling air to flow through the server 9 is created on the housing walls perpendicular to the insertion direction on the server 9.

For the switching of data connections between a server 9 and the rack 1 or between a plurality of servers 9, a switching unit 11 is configured on the upper side of the housing 2. The switching unit 11 may, for example, be a switch or router to switch data connections between servers 9. In particular, the data line 6a or further data lines (not shown), for example, a management bus system or other communication channels, open out into the switching unit 11, which may also be designed in multiple form. The switching unit 11 therefore represents a central node point of the rack 1 in relation to the data connection between different slot-in components.

However, as an alternative to the design according to FIG. 1, it is also possible to route data lines, in particular the optical data line 6a, away along the walls of the housing 2 to the front or rear on the rack 1 so that external components (not shown) can be connected to the data line 6a. This also allows a switching of data to the environment of the rack 1, which can be used, for example, in a structure with a plurality of racks 1.

Figure 2:
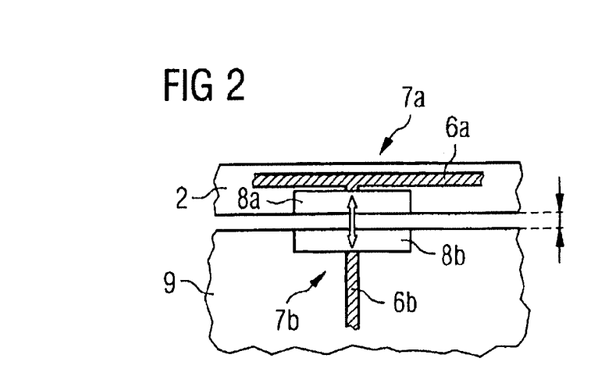
FIG. 2 shows a schematic sectional image through a part of the housing of a rack and a part of a server.

FIG. 2 shows a schematic section through a part of the housing 2 and a part of a server 9 which is completely inserted into the mounting bay 3 according to FIG. 1. In particular, FIG. 2 illustrates the flush and congruent arrangement of the two data interfaces 8a and 8b, wherein the data interface 8a is disposed in the housing 2 and the data interface 8b is disposed in the server 9. The server 9 is disposed flush with the housing 2 such that the spacing between the two optical data interfaces 8a and 8b can be kept very small, for example, a few millimeters. Also due to the fact that the data interfaces 8a and 8b are integrated into the respective walls and have no additional structural height, a space-saving integration is achieved and adapted to the installation spacing between the housing 2 and the server 9.

FIG. 2 illustrates the respective end sections 7a and 7b formed from optical waveguides of the data lines 6a and 6b and from data interfaces 8a and 8b connected thereto. Data can thus be transported via the optical waveguides of the data lines 6a and 6b toward or away from the data interfaces 8a and 8b. The optical waveguides of the data lines 6a and 6b may, for example, be formed as optical fiber cables. In particular, the optical fibers can be designed as so-called "gradient" fibers with a radially decreasing refractive index or as so-called "step-index" fibers with a discretely delimited refractive index. The latter are used as multimode or monomode fibers. The advantage of multimode fibers is that different wavelengths (modes) can be transported, as a result of which signals at different frequencies can be transmitted in parallel. Particularly over shorter distances, multimode fibers offer an interference-proof information transmission with good channel division.

FIG. 2 shows only schematically the structure of the assembly, wherein in particular the data lines 6a and 6b are to be designed such that a loss-minimized forwarding of light waves in the optical waveguides is enabled. Optical signals can be forwarded to the data interfaces 8a and 8b or can be picked up from the latter (see double arrow between the data interfaces 8a and 8b). In particular, the data interfaces 8a and 8b have components to transmit and receive light wave signals. A detailed structure of the data interfaces 8a and 8b is further explained in FIG. 5.

Due to the congruent arrangement of the data interfaces 8a and 8b on walls parallel to the insertion direction of the server 9 (see FIG. 1), a data connection is enabled between the server 9 and the housing 2 of the rack 1 without a data connection of this type having to be configured on the rear wall of the housing 2 perpendicular to the insertion direction. Due to the compact design of the data connection between the data interfaces 8a and 8b, no mechanical plug-in connections are required between the housing 2 and the server 9. In particular due to the contactless optical data connection between the server 9 and the housing 2, the configuration of the data connection is totally independent from a mechanical connection of the server 9 with the housing 2.

Figure 3:
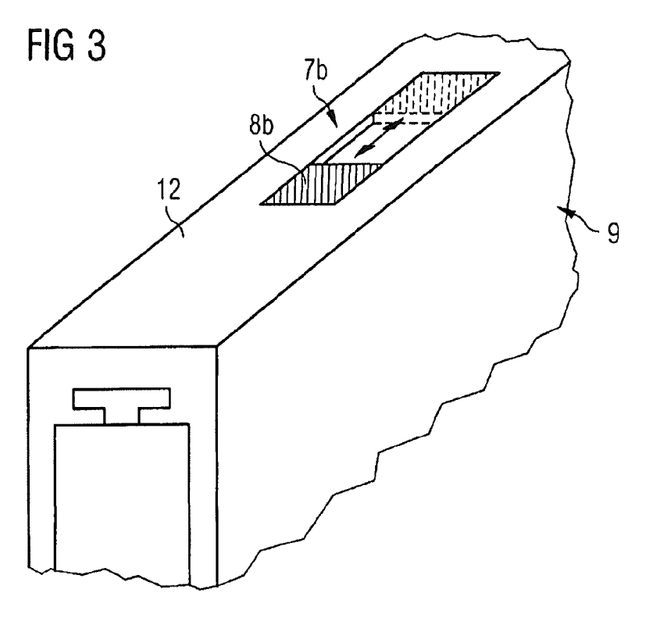
FIG. 3 shows a top view of a part of a server.

FIG. 3 shows a top view of a part of the server 9, wherein the end section 7b with the data interface 8b is disposed on the external wall 12 of the server 9. The data interface 8b is variable in its position on the external wall 12. This means that it can be moved into a multiplicity of positions on the external wall so that the position of the data interface 8b can be adapted to a position of a corresponding data interface 8a according to FIGS. 1 and 2 such that the two data interfaces 8a and 8b are disposed at the same height and congruently, In this way, the data interface 8b can be adapted to different dimensions and installation depths of servers 9 in relation to the position of the data interface 8a in the housing 2 of the rack 1.

Figure 4:
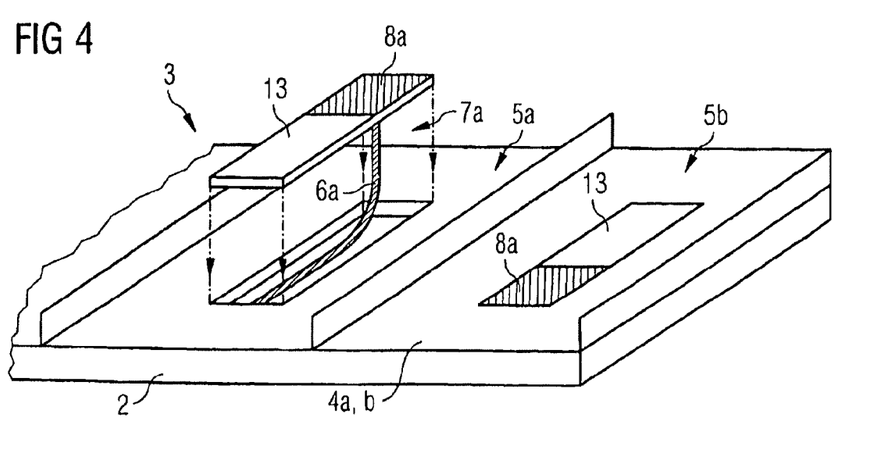
FIG. 4 shows a top view of a part of an internal wall of a housing.

FIG. 4 shows a top view of a part of the housing 2, in particular an internal wall 4a or 4b, which is divided into a plurality of slots and defines the mounting bay 3. In particular, two slots 5a and 5b are shown, which in each case have a data interface 8a for the optical data connection to a data interface 8b of a server 9 according to FIGS. 1 to 3.

The data interfaces 8a are disposed on assembly devices 13, Via the assembly devices 13, which are of plate-shaped design, the data interfaces 8a can be fixed in this design by way of example in two positions on the housing 2. A first position is derived from the left slot 5a, wherein the data interface 8a is aligned toward a rear wall. The left slot 5a shows the data interface 8a with the assembly device 13 in a not yet completely assembled position. The data line 6a, which is fed into the housing 2 in the form of an optical fiber or other optical waveguide, emerges from the data interface 8a on the end section 7a. Finally, the assembly device 13 can be inserted downwardly into an assembly opening on the housing 2 and can be fixed there via locking means (not shown), It is to be provided here that the data line 6a is also routed accordingly such that it does not oppose an assembly of the assembly device 13 or suffer damage. In this way, the data interface 8a can be fixed in a rearward position on the mounting bay 5a of the housing 2.

The right mounting bay 5b shows the already completely assembled data interface 8a in a second position located away from a rear wall toward a front side of the housing 2. The corresponding assembly device 13 has been rotated, for example, through 180° and then inserted into the assembly opening so that the data interface 8a is fixed in the position shown.

In this way, the position of a data interface 8a on a slot 5a or 5b of the housing 2 can be modified via the assembly device 13 so that the position of the data interface 8a can be adapted to different positions of data interfaces 8b on servers 9.

Along with the examples shown, it is of course possible to provide alternative designs of the assembly devices 13. Rail structures, for example, can be provided to move the data interfaces 8a into different positions similar to the design according to FIG. 3.

Figure 5:
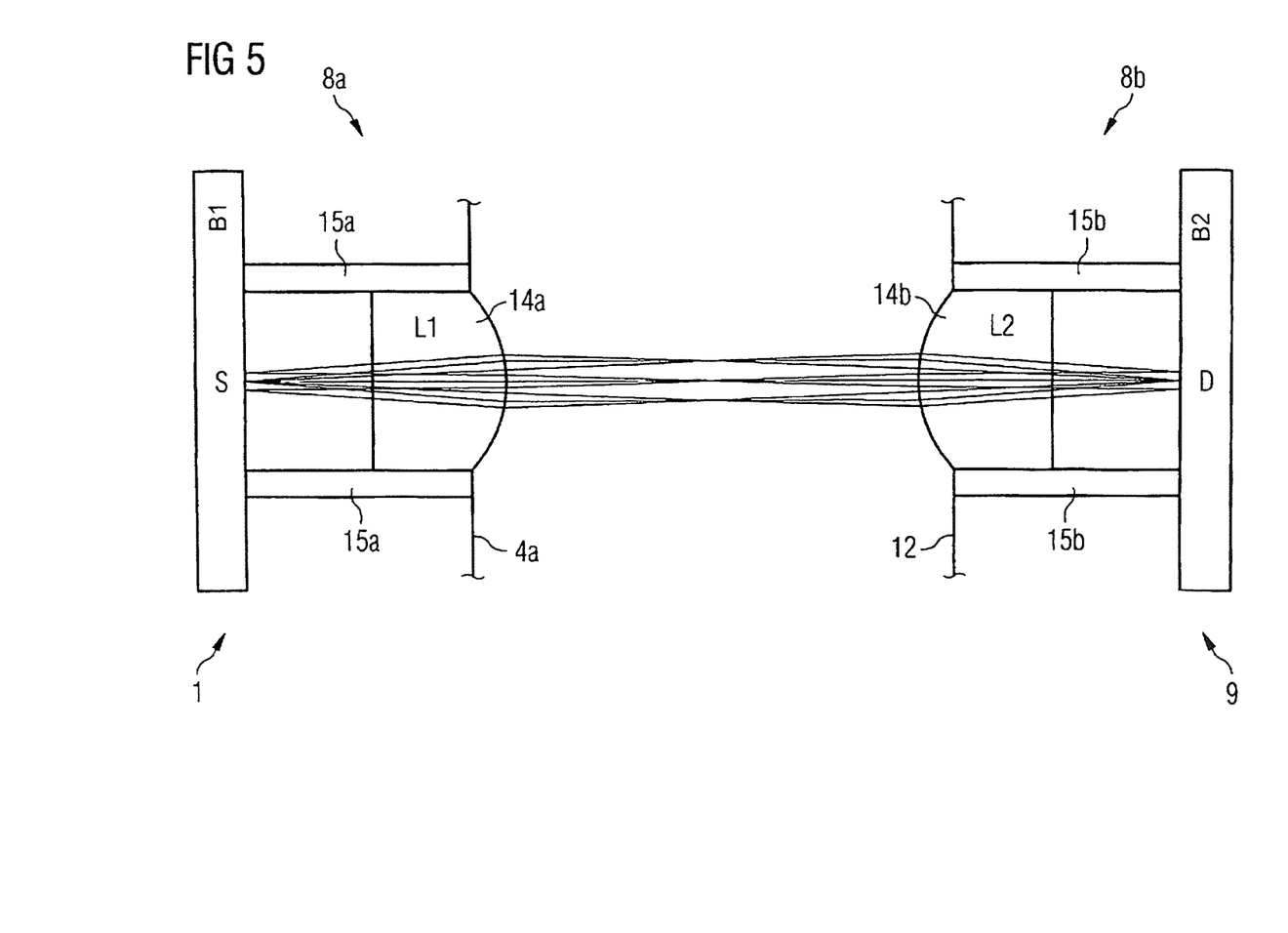
FIG. 5 shows a schematic structure of essential components of an optical contactless data connection.

FIG. 5 shows an example of a structure of at least a part of the data interfaces 8a and 8b on the rack 1 and on the server 9, which stand opposite one another at the same height in the installed condition of the server 9.

A transmitting unit S of the data interface 8a and a detector unit D of the data interface 8b are shown by way of example according to FIG. 5. However, it is of course possible that the data interface 8a also has a detector unit and the data interface 8b has a corresponding transmitting unit. In particular, the respective data interfaces can be designed as bidirectional. However, the data exchange from the data interface 8a to the data interface 8b will be illustrated here by way of example.

The data interfaces 8a and 8b are assembled on a system board board 1 and board 2. The system boards board 1 and board 2 provide both the mechanical and the electronic platform for the data interfaces 8a and 8b. The transmitting and detector units S and D are integrated into the system boards board 1 and board 2. The transmitting unit S may, for example, be designed in the form of one or more laser light emitting surface diodes (VCSEL=Vertical Cavity Surface Emitting Laser). Laser diodes of this type have the advantage that they are low in manufacturing costs and in power consumption and yet enable a high insertion efficiency for inserting light waves into optical fibers.

The detector unit D may, for example, be designed in the form of photodiodes, further photodetectors or photosensors or electro-optical transducers. It is also possible to provide entire fields or matrix arrays of photodetectors to detect light waves in a two-dimensional field. It is conceivable to use so-called "CCD" sensors (CCD=Charge Coupled Device).

Furthermore, the data interfaces 8a and 8b have an optical system 14a and 14b, in particular lens assemblies L1 and L2, for the bundling and directional insertion and extraction of light waves. An optical system 14a and 14b of this type finally allows an efficient, contactless optical transmission of light waves between the two data interfaces 8a and 8b. The lenses L1 and L2 of the optical system 14a and 14b are disposed on an internal wall 4a of the rack 1 or on an external wall 12 of the server 9 such that they have visual contact with the respective other optical system of the other data interface.

To adapt the fine alignment of the two data interfaces 8a and 8b in relation to one another and, in connection therewith, to improve a transmission level or the transmission coefficient, the data interfaces 8a and 8b, in particular their optical system 14a and 14b, can be fine-mechanically aligned via adjusting elements 15a and 15b. Adjusting elements 15a, 15b of this type may, for example, be permanent magnets and/or electromagnets and piezo elements. In this way, the data interfaces 8a and 8b are mounted in a floating manner and can, for example, compensate for mechanical manufacturing tolerances or can be adapted to changes in their alignment due to vibrations caused by rotating parts in a corresponding server 9. Thus, a tilting of the lenses L1 and L2 is thus enabled via the adjusting elements 15a and 15b, as a result of which the directions of the light beams can be modified accordingly so that, despite fine modifications in the alignment of the data interfaces 8a and 8b in relation to one another, an optimum transmission of the light signals, in particular into a quasi-focal point of the detector unit D, is nevertheless still guaranteed.

FIG. 5 shows schematically beam bundles of light beams uncoupled from the transmitting unit S of the data interface 8a via the optical system L1, are transmitted contactlessly via the air to the optical system L2 of the data interface 8b and are captured there and refracted and incoupled into a detector unit D. Corresponding optical waveguides can connect to the system boards board 1 and board 2 to route the light signals. However, the optical waveguides are not shown in FIG. 5 for the sake of simplicity.

The configurations shown are selected merely by way of example, wherein alternative examples are possible. In particular, the mechanical structure of a rack 1 and a server 9, and also the design of the data interfaces 8*a* and 8*b* according to FIG. 5 are merely selected by way of example for explanation. The essential notion entails laying optical data interfaces between the rack 1 and a server 9 inserted therein away from a rear wall of the rack 1 to an internal wall of the rack 1 or to an external wall of the server 9 parallel to an insertion direction of the server 9 into the rack 1 so that the data interfaces 8*a* and 8*b* no longer lie in and impede a cooling airstream through the rack 1. In this way, free space is gained on the rear wall of the rack 1 to configure means to generate the cooling airstream.

The invention claimed is:

1. A rack with a mounting bay to accommodate servers, wherein 1) the mounting bay defines two opposing internal areas disposed parallel to an insertion direction of the servers and divided into a multiplicity of slots, 2) one or more data lines for data connection of servers are configured in the rack and integrated into at least one of the two internal areas disposed parallel to the insertion direction of the servers, 3) the data lines comprise optical data lines, and 4) an end section of a data line with a data interface is disposed level with each slot such that a contactless optical data connection to a further data interface on a corresponding server is enabled.

2. The rack according to claim 1, wherein the rack is a server rack.

3. The rack according to claim 1, wherein the rack is a blade server housing.

4. The rack according to claim 1, further comprising a device arranged in the rack that generates a cooling airstream such that the direction of the cooling airstream is parallel to the insertion direction of the servers.

5. The rack according to claim 1, wherein the end sections of the data lines with the data interfaces are directed toward a corresponding server and comprise an optical waveguide and an optical system connected thereto to incouple and uncouple light waves.

6. The rack according to claim 5, wherein the end sections have an assembly of one or more adjusting elements configured for fine-mechanical alignment of the optical system.

7. The rack according to claim 1, wherein the end sections are variable in their position on the slots.

8. The rack according to claim 1, wherein the data lines are routed in the rack and connected to a switching unit disposed in the rack for selective connection of servers.

9. An assembly with a rack according to claim 1 and at least one server adapted to be inserted into a slot of a rack, wherein the server, at least on one external wall, has an end section of an optical data line with a data interface configured to enable a contactless optical data connection to a data interface of the rack and wherein the server is inserted into a slot of the mounting bay, wherein the server has the end section of the optical data line with the data interface at least on one external wall disposed parallel to the corresponding internal area on the slot, and wherein the data interface of the server is disposed level with the data interface of the slot such that a contactless optical data connection between the two data interfaces is enabled.

10. The assembly according to claim 9, wherein the server is a rack server.

11. The assembly according to claim 9, wherein the server is a blade server.

12. The assembly according to claim 9, wherein the server further comprises a device arranged in the server that generates a cooling airstream through the server such that a direction of the cooling airstream is formed parallel to an insertion direction of the server in the rack.

13. The assembly according to claim 9, wherein the end section of the data line with the data interface of the server comprises an optical waveguide and an optical system connected thereto to incouple and uncouple light waves.

14. The assembly according to claim 13, wherein the end section in the server has an assembly of one or more adjusting elements configured for fine-mechanical alignment of the optical system.

15. The assembly according to claim 9, wherein the end section of the server is variable in its position on the external wall of the server.

\* \* \* \* \*

UNITED STATES PATENT AND TRADEMARK OFFICE
CERTIFICATE OF CORRECTION

PATENT NO. : 9,582,450 B2
APPLICATION NO. : 14/008261
DATED : February 28, 2017
INVENTOR(S) : Thomas Lück It is certified that error appears in the above-identified patent and that said Letters Patent is hereby corrected as shown below:

On the Left hand Column, the Assignee information should be corrected as shown below:
Item -- (73) Assignee: FUJITSU LIMITED, Kawasaki (JP) --

Signed and Sealed this
Twenty-eighth Day of August, 2018

Andrei Iancu
*Director of the United States Patent and Trademark Office*